(12) United States Patent
Taguchi

(10) Patent No.: US 9,318,646 B2
(45) Date of Patent: Apr. 19, 2016

(54) LED DEVICE MANUFACTURING METHOD AND FLUORESCENT MATERIAL-DISPERSED SOLUTION USED IN SAME

(71) Applicant: Konica Minolta, Inc., Tokyo (JP)

(72) Inventor: Yoshihito Taguchi, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/349,548

(22) PCT Filed: Oct. 5, 2012

(86) PCT No.: PCT/JP2012/006416
§ 371 (c)(1),
(2) Date: Apr. 3, 2014

(87) PCT Pub. No.: WO2013/051281
PCT Pub. Date: Apr. 11, 2013

(65) Prior Publication Data
US 2015/0004728 A1    Jan. 1, 2015

(30) Foreign Application Priority Data

Oct. 7, 2011    (JP) .................................. 2011-223213

(51) Int. Cl.
*H01L 21/00*    (2006.01)
*H01L 33/00*    (2010.01)
(Continued)

(52) U.S. Cl.
CPC ............ *H01L 33/005* (2013.01); *C09K 11/025* (2013.01); *C09K 11/7774* (2013.01);
(Continued)

(58) Field of Classification Search
CPC ............... H01L 2933/0025; H01L 2933/0041; H01L 33/005; C09K 11/02
USPC .......................... 252/301.36; 438/34; 977/932
See application file for complete search history.

(56) References Cited

U.S. PATENT DOCUMENTS 5,013,585 A * 5/1991 Shimizu et al. ............... 427/220
6,235,401 B1 * 5/2001 Ogata et al. .................... 428/472
(Continued)

FOREIGN PATENT DOCUMENTS

DE    102009010468 A1    5/2010
EP         2608284 A1    6/2013
(Continued)

OTHER PUBLICATIONS

Translation of WO2011/065322A1, Hatano Takuji et al (Konica Minolta Opto Inc) Jun. 3, 2011, 15 pages.*
(Continued)

*Primary Examiner* — Caridad Everhart
(74) *Attorney, Agent, or Firm* — Lucas & Mercanti, LLP

(57) ABSTRACT

The present invention addresses the problem of providing an LED device having no color unevenness in light emission. In order to solve the problem, this LED device manufacturing method includes: a step of providing an LED chip-mounted package; a step of film-forming a fluorescent material layer by applying a fluorescent material-dispersed solution to a emission surface of the LED chip, said fluorescent material-dispersed solution containing a solvent, a fluorescent material, clay minerals and porous inorganic particles, and by drying the fluorescent material-dispersed solution; and a step of film-forming a wavelength conversion section by applying, to the fluorescent material layer, a precursor solution having a precursor of a light transmissive ceramic dispersed in a solvent, and by firing the layer, said wavelength conversion section being composed of a light transmissive ceramic layer having the fluorescent material, the clay minerals and the porous inorganic particles dispersed therein.

8 Claims, 5 Drawing Sheets

(51) Int. Cl.
*H01L 33/50* (2010.01)
*C09K 11/02* (2006.01)
*C09K 11/77* (2006.01)

(52) U.S. Cl.
CPC ............ *H01L33/505* (2013.01); *H01L 33/507* (2013.01); *H01L 2933/0025* (2013.01); *H01L 2933/0041* (2013.01)

(56) References Cited

U.S. PATENT DOCUMENTS

| | | |
|---|---|---|
| 6,791,259 B1 * | 9/2004 | Stokes et al. .................. 313/503 |
| 7,157,745 B2 | 1/2007 | Blonder |
| 2002/0163302 A1 | 11/2002 | Nitta |
| 2005/0107478 A1 * | 5/2005 | Klimov et al. .................. 516/98 |
| 2006/0170332 A1 * | 8/2006 | Tamaki et al. ................. 313/498 |
| 2009/0176323 A1 * | 7/2009 | Suzuki et al. .................... 438/26 |
| 2009/0272996 A1 * | 11/2009 | Chakraborty .................... 257/98 |
| 2010/0194263 A1 * | 8/2010 | Winkler et al. ............... 313/486 |
| 2010/0277673 A1 | 11/2010 | Hoelen |
| 2012/0235190 A1 * | 9/2012 | Keller et al. .................... 257/98 |
| 2012/0256223 A1 | 10/2012 | Washizu |
| 2013/0143343 A1 | 6/2013 | Kojima |
| 2013/0149801 A1 | 6/2013 | Kojima |
| 2013/0344633 A1 | 12/2013 | Washizu |
| 2014/0349419 A1 | 11/2014 | Kojima |

FOREIGN PATENT DOCUMENTS

| | | |
|---|---|---|
| EP | 2685512 A1 | 1/2014 |
| JP | 2000349347 | 12/2000 |
| JP | 3307316 B | 5/2002 |
| JP | 2002-314142 A | 10/2002 |
| JP | 2004088013 A | 3/2004 |
| JP | 2004-153109 A | 5/2004 |
| JP | 2011-114086 A | 6/2011 |
| WO | WO2009/083887 A | 7/2009 |
| WO | WO2010/123059 A | 10/2010 |
| WO | WO2011/065322 A | 3/2011 |
| WO | 2011077548 A1 | 6/2011 |
| WO | 2011096074 A1 | 8/2011 |

OTHER PUBLICATIONS

Translation of JP2011-1140086A, Tetsuya Nishi et al (Panasonic Electric Works Co Ltd) Jun. 9, 2011, 15 pages.*
Translation of JP20003-349347, Akira Shiraishi et al (Sanken Electric Co Ltd) Dec. 15, 2000, 15 pages.*
Extended European Search Report dated Apr. 1, 2015 for the corresponding European Patent Application No. EP12838152.2.
Office Action dated Sep. 8, 2015 issued from the corresponding Japanese patent application No. 2013-537426.
English translation of Office Action dated Sep. 8, 2015 issued from the corresponding Japanese patent application No. 2013-537426.

* cited by examiner

LED DEVICE MANUFACTURING METHOD AND FLUORESCENT MATERIAL-DISPERSED SOLUTION USED IN SAME

CROSS REFERENCE TO RELATED APPLICATION

This Application is a 371 of PCT/JP2012/006416 filed on Oct. 5, 2012 which, in turn, claimed the priority of Japanese Patent Application No. JP2011-223213 filed on Oct. 7, 2011 both applications are incorporated herein by reference.

TECHNICAL FIELD

The present invention relates to a method for manufacturing an LED device, and a phosphor dispersion liquid to be used in the same.

BACKGROUND ART

Several LED devices are known as white light-emitting devices using an LED. For example, there has been widely used a technique of obtaining a white light-emitting device by disposing a phosphor such as a YAG phosphor near a gallium nitride (GaN) blue LED (Light-Emitting Diode) chip so that blue light emitted from the blue LED chip is mixed with yellow light emitted by the secondary emission of the phosphor upon receiving the blue light. Another known technique of obtaining a white light-emitting device uses a combination of a blue LED chip that emits blue light, a phosphor that emits red light upon receiving blue light, and a phosphor that emits green light, so that the colors of the respective lights from the chip and the phosphors are mixed.

White light-emitting devices using an LED are finding various applications, and representative examples include substitutions for conventional fluorescent lamps and incandescent lamps. In addition to such common applications, applications to lighting apparatuses in which very high luminance is required such as headlights of motor vehicles have also been investigated in recent years. In such applications, since high recognition of distant objects (such as signs) is required, high performance is required also in the uniformity of the tint in the white light-emitting device and the color in the irradiation area.

In common white light-emitting devices, transparent resins in which phosphor particles are dispersed are used to encapsulate the LED chip and mounting units. However, in the applications as described above in which a higher level of color uniformity is required, a structure in which an LED chip and the like are encapsulated merely with phosphor particles being dispersed in transparent resin has had such a problem that the phosphor particles having higher specific gravity than the transparent resin settle down before the resin is cured, causing color unevenness upon luminescence.

Consequently, various methods have been proposed for reducing settling of phosphors to prevent the occurrence of color unevenness. For example, it is reported that settling and segregation of phosphors is reduced by using as an encapsulating material a silicone resin having a viscosity upon curing of 100 mPa·s to 10,000 mPa·s (see PTL 1). There are also disclosed a light-emitting device in which a lipophilic compound is added as an anti-settling agent of phosphors to a liquid light transmissive encapsulating material, the compound being prepared by adding organic cations to a laminar compound mainly including a clay mineral, and a method for manufacturing the same (see PTL 2).

According to the techniques described in these literatures, the occurrence of color unevenness due to the settling of phosphor particles can be reduced to some extent. However, phosphors are dispersed in the organic resin in all these techniques. Therefore, when used in a white light-emitting device using a high luminance LED as described above, organic resin materials are degraded due to heat of the LED itself and/or heat by the emission of light from the phosphor particles excited by the light from the LED. When organic resin materials are degraded, there are cases where resins are colored to cause a reduction in transmittance and/or cases where problems like color unevenness and surface scattering caused by the deformation of the resin. Further, even when an LED does not have high luminance, such problems may frequently occur with the lapse of time. Therefore, improvements have been required in the art.

As a technique of increasing the heat resistance of the white light-emitting LED device, a technique has been proposed in which phosphor particles are dispersed in a solution containing a metal alkoxide or a ceramic precursor composition, and then the resulting dispersion is applied to an LED chip and heated to form a phosphor particle-containing ceramic (glass) layer that encapsulates the LED chip (see PTL 3). Further, a technique of adding inorganic particles to a dispersed solution as an anti-settling agent for phosphor particles has been proposed (see PTL 4).

CITATION LIST

Patent Literature

PTL 1
Japanese Patent Application Laid-Open No. 2002-314142
PTL 2
Japanese Patent Application Laid-Open No. 2004-153109
PTL 3
Japanese Patent No. 3307316
PTL 4
U.S. Pat. No. 7,157,745

SUMMARY OF INVENTION

Technical Problem

However, even if a phosphor-dispersed solution to which inorganic particles are added is used as described in PTL 4, it has been difficult to form a phosphor layer that achieves color unevenness reduced to an extent that the layer can be used in applications requiring high color uniformity. Further, it has been found that when a large amount of inorganic particles are added to a phosphor dispersion liquid in order to reduce the settling of the phosphors, transmittance may be reduced due to scattering of light by the inorganic particles or the like, and/or the smoothness of the surface of the layer containing the phosphor may be impaired to cause light scattering. On the other hand, when the amount of inorganic particles added is reduced, it is unable to sufficiently reduce the settling of phosphors, and it has been difficult to sufficiently remove color unevenness.

When a laminar compound is added as an anti-settling agent of a phosphor as described in PTL 2 to a solution containing phosphor particles and a ceramic precursor such as a metal alkoxide as described in PTL 3, the dispersion state of the phosphor particles has been stabilized to some extent, and it has been able to reduce the occurrence of color unevenness. However, the viscosity of the solution cannot be sufficiently increased, and the phosphors settle down before the precursor is cured. For this reason, the uniformity of the phosphor particles in the phosphor layer is impaired, and as a result, it has been unable to sufficiently reduce color unevenness.

The present invention has been made in view of such circumstances, and an object of the present invention is to uniformly disperse phosphor particles without incorporating an organic resin as a binder into a wavelength conversion part (phosphor layer) of an LED device. Thereby, the color unevenness of the emission of the LED device is reduced, and there is provided an LED device that is sufficiently usable also in applications requiring very high color uniformity. There is also provided a light-emitting device excellent also in durability.

Solution to Problem

Specifically, a first aspect of the present invention relates to methods for manufacturing an LED device given below.

[1] A method for manufacturing an LED device having an LED chip and a wavelength conversion part to convert light emitted from the LED chip to light having a wavelength different from a wavelength of the light emitted from the LED chip, the method including:
providing an LED chip package including a package and an LED chip disposed on the package, the LED chip having an emission surface;
applying on the emission surface of the LED chip a phosphor dispersion liquid containing a solvent, a phosphor, a clay mineral and porous inorganic particles, the phosphor, the clay mineral and the porous inorganic particles being dispersed in the solvent, followed by drying to form a phosphor layer; and
applying on the phosphor layer a precursor solution in which a light transmissive ceramic precursor is dispersed in a solvent, followed by calcination to form a wavelength conversion part made of a light transmissive ceramic layer in which the phosphor, the clay mineral and the porous inorganic particles are dispersed.

[2] A method for manufacturing an LED device having an LED chip and a wavelength conversion part to convert light emitted from the LED chip to light having a wavelength different from a wavelength of the light emitted from the LED chip, the method including:
applying on a light transmissive substrate a phosphor dispersion liquid containing a solvent, a phosphor, a clay mineral and porous inorganic particles, the phosphor, the clay mineral and the porous inorganic particles being dispersed in the solvent, followed by drying to form a phosphor layer;
applying on the phosphor layer a precursor solution in which a light transmissive ceramic precursor is dispersed in a solvent, followed by calcination to form a wavelength conversion part made of a light transmissive ceramic layer in which the phosphor, the clay mineral and the porous inorganic particles are dispersed; and
installing the light transmissive substrate on which the wavelength conversion part is formed in an LED chip package including a package and an LED chip having an emission surface and disposed on the package.

[3] A method for manufacturing an LED device having an LED chip and a wavelength conversion part to convert light emitted from the LED chip to light having a wavelength different from a wavelength of the light emitted from the LED chip, the method including:
providing an LED chip package including a package and an LED chip disposed on the package, the LED chip having an emission surface; and
applying on the emission surface of the LED chip a phosphor dispersion liquid containing a solvent, a phosphor, a clay mineral, porous inorganic particles and a light transmissive ceramic precursor, the phosphor, the clay mineral, the porous inorganic particles and the light transmissive ceramic precursor being dispersed in the solvent, followed by calcination to form a wavelength conversion part made of a light transmissive ceramic layer in which the phosphor, the clay mineral and the porous inorganic particles are dispersed.

[4] A method for manufacturing an LED device having an LED chip and a wavelength conversion part to convert light emitted from the LED chip to light having a wavelength different from a wavelength of the light emitted from the LED chip, the method including:
applying on a light transmissive substrate a phosphor dispersion liquid containing a solvent, a phosphor, a clay mineral, porous inorganic particles and a light transmissive ceramic precursor, the phosphor, the clay mineral, the porous inorganic particles and the light transmissive ceramic precursor being dispersed in the solvent, followed by calcination to form a wavelength conversion part made of a light transmissive ceramic layer in which the phosphor, the clay mineral and the porous inorganic particles are dispersed; and
installing the light transmissive substrate on which the wavelength conversion part is formed in an LED chip package including a package and an LED chip having an emission surface and disposed on the package.

[5] The manufacturing method according to any one of [1] to [4], in which the specific surface area of the porous inorganic particles is 200 m$^2$/g or more.

[6] The manufacturing method according to any one of [1] to [4], in which an average particle size of primary particles of the porous inorganic particles is 0.001 to 50 μm.

[7] The manufacturing method according to any one of [1] to [4], in which in the light transmissive ceramic layer, an amount of the porous inorganic particles is 0.5 to 50 wt %, and an amount of the clay mineral is 0.5 to 20 wt %.

A second aspect of the present invention relates to phosphor dispersion liquids given below.

[8] A phosphor dispersion liquid containing a solvent, a phosphor, a clay mineral and porous inorganic particles, the phosphor, the clay mineral and the porous inorganic particles being dispersed in the solvent.

[9] A phosphor dispersion liquid containing a solvent, a phosphor, a clay mineral, porous inorganic particles and a light transmissive ceramic precursor, the phosphor, the clay mineral, the porous inorganic particles and the light transmissive ceramic precursor being dispersed in the solvent.

[10] The phosphor dispersion liquid according to [8] or [9], in which in the phosphor dispersion liquid, an amount of the porous inorganic particles is 0.1 to 40 wt %, and an amount of the clay mineral is 0.05 to 18 wt %.

Advantageous Effects of Invention

In the method for manufacturing an LED device of the present invention, a wavelength conversion layer is formed by applying a phosphor dispersion liquid containing porous inorganic particles. The phosphors are uniformly dispersed by the thickening effect of the porous inorganic particles without being precipitated in the phosphor dispersion liquid. The phosphor dispersion liquid is applied with the phosphors being evenly dispersed. Since settling of the phosphors does not occur, stable application can be performed over time.

When a coating film of the phosphor dispersion liquid is calcined, a solvent volatilizes, and a wavelength conversion part (phosphor layer) in which phosphor particles and porous inorganic particles are uniformly dispersed is formed on the light-emitting device. Thus, an LED device that does not have color unevenness in emission can be provided.

DESCRIPTION OF EMBODIMENTS

1. LED Device
[LED Device]

Figure 1:
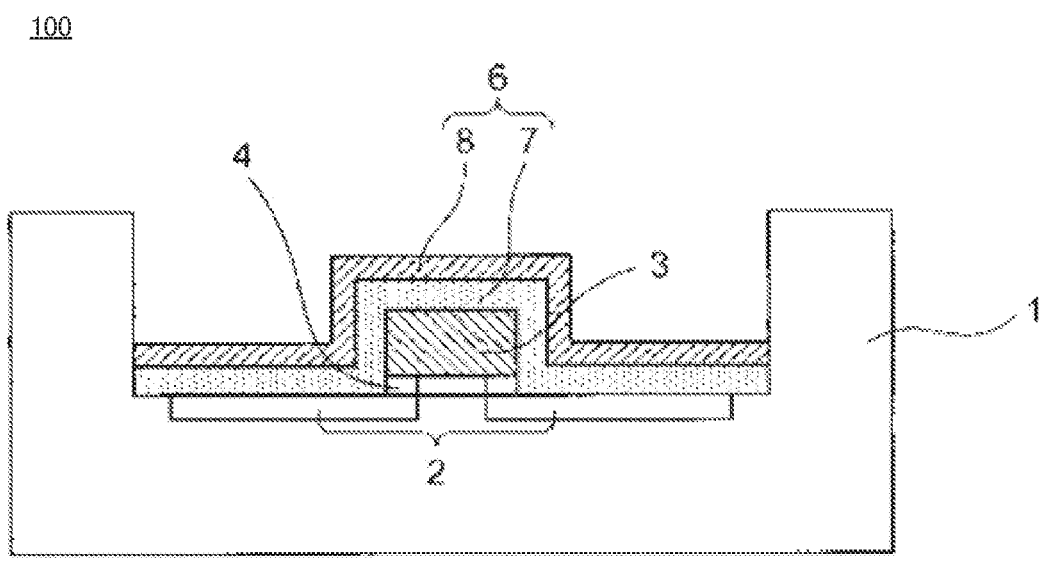
FIG. 1 is a cross-sectional view of a first exemplary LED device.
Figure 2:
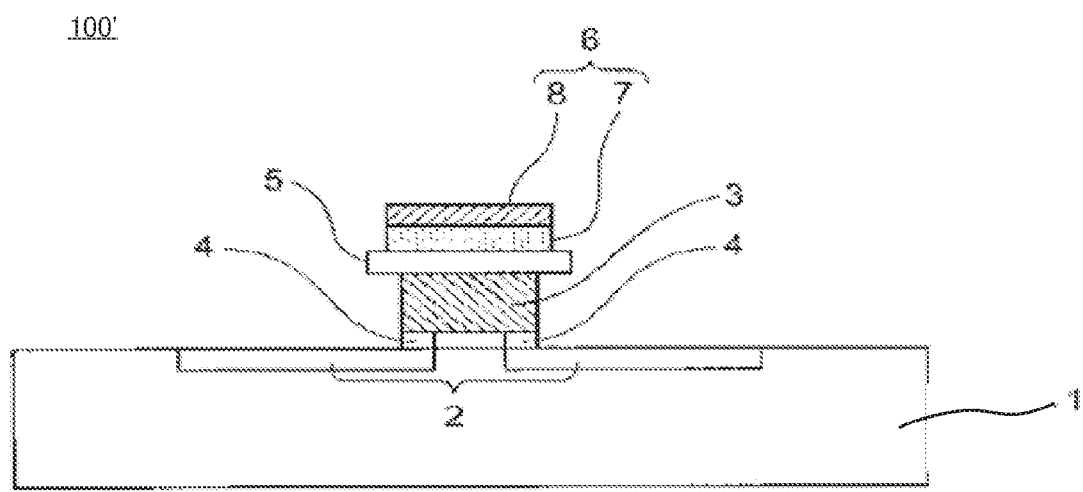
FIG. 2 is a cross-sectional view of a second exemplary LED device.
Figure 3:
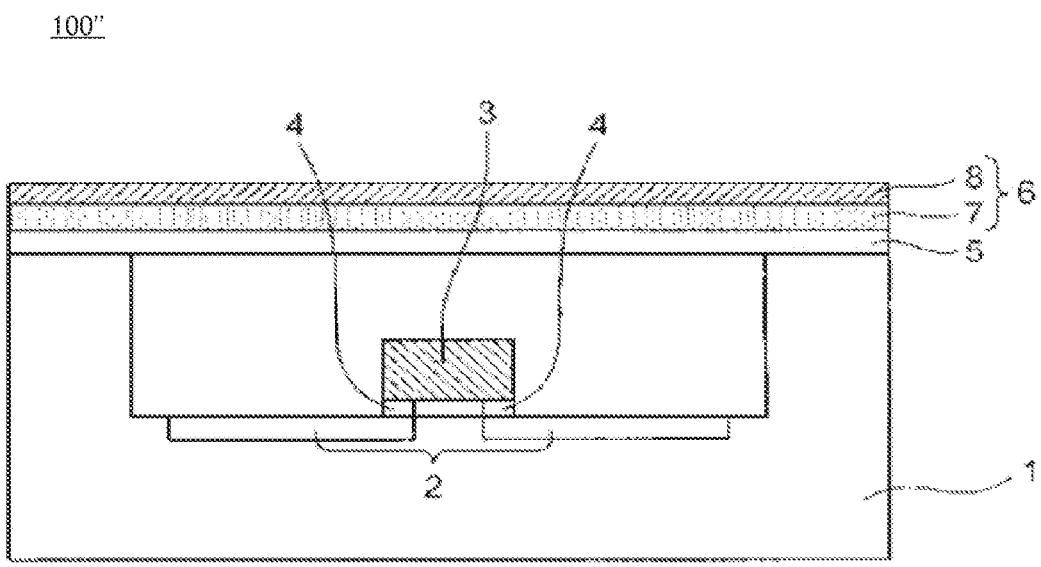
FIG. 3 is a cross-sectional view of a third exemplary LED device.

An LED device includes a package, an LED chip and a light transmissive ceramic layer (containing a phosphor) that covers the emission surface of the LED chip, and has an optional protective layer that covers the phosphor layer. FIG. 1 is a cross-sectional view of first exemplary LED device 100. FIG. 2 is a cross-sectional view of second exemplary LED device 100'. FIG. 3 is a cross-sectional view of third exemplary LED device 100".

LED device 100 of FIG. 1 includes package 1 having a cavity, metal part (metal interconnection) 2, LED chip 3 disposed in the cavity of package 1, and bump electrodes 4 that connect metal part 2 and LED chip 3. The mode of bonding in which metal part 2 and LED chip 3 are connected via bump electrodes 3 in this manner is called flip-chip bonding.

LED device 100' of FIG. 2 includes plate package 1, metal part (metal interconnection) 2, LED chip 3 disposed on package 1, and bump electrodes 4 that connects metal part 2 and LED chip 3.

LED device 100" of FIG. 3 includes plate package 1 having a cavity, metal part (metal interconnection) 2, LED chip 3 disposed in the cavity of package 1, and bump electrodes 4 that connect metal part 2 and LED chip 3.

Package 1 is made of liquid crystal polymer or ceramic, for example. The material of package 1 is not particularly limited as long as it has insulating property and heat resistance.

LED chip 3 is a blue LED chip, for example. An exemplary configuration of a blue LED chip is a laminate of n-GaN semiconductor layer (clad layer), InGaN semiconductor layer (emission layer), p-GaN semiconductor layer (clad layer), and transparent electrode layer, grown on sapphire substrate.

LED chip 3 has a surface that measures, for example, 200 to 300 µm by 200 to 300 µm and has a height of, for example, several tens of micrometers.

LED device (100, 100', or 100") shown in FIG. 1 to FIG. 3 includes one LED chip 3 disposed in one package 1. A plurality of LED chips 3 may be disposed in one package 1.

LED device (100, 100', or 100") further has wavelength conversion part 6 that covers the emission surface of LED chip 3. Wavelength conversion part 6 includes light transmissive ceramic layer 7, and may include optional protective layer 8. Light transmissive ceramic layer 7 is a layer containing a phosphor and a binder to bind the phosphor. Protective layer 8 may be a layer made of a transparent ceramic.

Light transmissive ceramic layer 7 may be directly formed on the emission surface of LED chip 3 as shown in FIG. 1. Alternatively, light transmissive ceramic layer 7 may be formed on transparent plate 5 (such as a glass plate) disposed on the emission surface of LED chip 3 as shown in FIGS. 2 and 3. Wavelength conversion part 6 may only cover the emission surface of LED chip 3 (typically the upper surface of the LED chip), and may also cover the side surface of LED chip 3 as shown in FIG. 1. The thickness of light transmissive ceramic layer 7 constituting wavelength conversion part 6 is, not particularly limited to, but preferably 15 µm to 300 µm, more preferably 20 µm to 100 µm.

LED device 100' of FIG. 2 has transparent plate 5 in contact with LED chip 3, and wavelength conversion part 6 is formed on the surface of transparent plate 5. LED device 100" of FIG. 3 has transparent plate 5 disposed in the opening of package 1 having a cavity, and wavelength conversion part 6 is formed on the surface of transparent plate 5.

The shape of transparent plate 5 is not particularly limited, but may be planar or lens shaped.

Light transmissive ceramic layer 7 constituting wavelength conversion part 6 is a layer to emit fluorescence upon receiving light (excitation light) emitted from LED chip 3. Light of a desired color is emitted from LED device (100, 100', or 100") by mixing the excitation light and the fluorescence. That is, light transmissive ceramic layer 7 functions as a wavelength conversion layer. For example, when light from LED chip 3 is blue, and fluorescence from light transmissive ceramic layer 7 is yellow, LED device (100, 100', or 100") will be a white LED device.

It is required that phosphor particles be uniformly distributed in light transmissive ceramic layer 7 in order to enable the emission of light of desired color from LED device (100, 100', or 100"). The phosphor dispersion liquid of the present invention is easily formed into light transmissive ceramic layer 7 in which phosphor particles are uniformly distributed.

Light transmissive ceramic layer 7 contains phosphor particles, clay mineral, porous inorganic particles, binder (transparent ceramic), and other optional components.

Phosphor Particles

The phosphor particles contained in light transmissive ceramic layer 7 are excited by emitted light having a specified wavelength (excitation wavelength) from the LED of the LED chip, and emit fluorescence having a wavelength different from the excitation wavelength. When an LED chip is used that emits blue light, a white LED device is obtained by employing phosphor particles that emit yellow fluorescence. Examples of phosphors that emit yellow fluorescence include YAG (yttrium-aluminum-garnet) phosphor. YAG phosphor can emit fluorescence of yellow light (550 to 650 nm wavelength) upon receipt of blue light (420 to 485 nm wavelength) emitted from the blue LED chip.

The phosphor may be produced for example by the method including: 1) mixing as flux an appropriate amount of fluoride such as ammonium fluoride with a mixed raw material having a predetermined composition followed by pressing to produce a molded article; and 2) loading the molded article into in a crucible followed by calcination in air at 1,350 to 1,450° C. for 2 to 5 hours to produce a sintered product.

The mixed raw material having a predetermined composition can be produced by fully mixing stoichiometric ratios of oxides of Y, Gd, Ce, Sm, Al, La and Ga or compounds that are easily converted to the oxides at elevated temperatures. Alternatively, the mixed raw material having a predetermined composition can be produced by mixing a coprecipitate oxide, aluminum oxide and gallium oxide, wherein the coprecipitate oxide is one produced by calcining a coprecipitate obtained using oxalic acid from a solution containing stoichiometric ratios of the rare earth elements Y, Gd, Ce and Sm in acid.

The phosphor is not limited to YAG phosphor; other phosphors, including Ce-free, non-garnet phosphor, can also be employed.

The average particle diameter of the phosphor particles is preferably 1 to 50 μm, more preferably 10 μm or less. Luminescence efficiency (conversion efficiency) increases with increasing phosphor particle diameter. On the other hand, when the particle diameter of the phosphor is too large, the gaps in the light transmissive ceramic layer that occur at the interfaces between the phosphor and binder become large enough to cause a reduction in the strength of the light transmissive ceramic layer. The average particle size of the phosphor can be measured for example by the Coulter counter method.

The concentration of the phosphor in light transmissive ceramic layer 7 is preferably 60 to 95 wt % based on the total mass of the phosphor, ceramic as a binder, and inorganic particles (including porous inorganic particles and other optional inorganic particles). Basically, the concentration of the phosphor particles in light transmissive ceramic layer 7 is higher the better. When the concentration of the phosphor in light transmissive ceramic layer 7 is increased, the ratio of the binder decreases, so that the phosphor particles in light transmissive ceramic layer 7 are liable to be uniformly distributed. Further, when the concentration of the phosphor is increased, a required amount of phosphor can be provided in the LED device even when the light transmissive ceramic layer 7 is made thin.

Further, when the concentration of phosphor particles in light transmissive ceramic layer 7 is high, the film strength of the layer can be increased because the phosphor particles adhere to each other. Furthermore, when the concentration of phosphor particles in light transmissive ceramic layer 7 is high, heat generated from the phosphor is liable to be dissipated from light transmissive ceramic layer 7.

On the other hand, when the concentration of the phosphor in light transmissive ceramic layer 7 is too high (more than 95 wt %), the ratio of the binder may be extremely reduced resulting failure to allow the phosphor particles to be bound to each other.

Clay Mineral

Examples of clay minerals include imogolite and allophane in addition to a laminar silicate mineral. As the laminar silicate mineral, swelling clay minerals having a structure such as mica structure, kaolinite structure or smectite structure are preferred, with swelling clay minerals having smectite structure, which is superior in swellability, is more preferred. Fine particles of the laminar silicate minerals are present as a card house structure in a phosphor dispersion liquid, and even a small amount thereof can significantly increase the viscosity of the phosphor dispersion liquid. Further, since the fine particles of laminar silicate minerals are planar, they can also improve the film strength of the light transmissive ceramic layer.

Examples of the laminar silicate minerals include smectite group clay minerals such as hectorite, saponite, stevensite, beidellite, montmorillonite, nontronite and bentonite, swelling mica group clay minerals such as Na-type tetrasilicic fluorine mica, Li-type tetrasilicic fluorine mica, Na-type fluorine taeniolite and Li-type fluorine taeniolite, vermiculite, kaolinite, and mixtures thereof. These minerals may be natural or synthetic.

The amount of the clay mineral in light transmissive ceramic layer 7 is preferably 0.5 to 20 wt %, more preferably 0.5 to 10 wt %. When the amount of clay minerals in light transmissive ceramic layer 7 is less than 0.5 wt %, the proportion of solid components such as a phosphor in a mixed solution increases and the dispersibility thereof decreases. On the other hand, when the amount of clay minerals exceeds 20 wt %, scattering of excitation light by clay minerals increases to reduce the luminance of the LED device as well as the strength of light transmissive ceramic layer 7.

Although the clay mineral has a thickening effect, the viscosity of the phosphor dispersion liquid is not increased only with the increase in the proportion of the clay mineral, but the viscosity is determined by the ratio of the clay mineral to other components such as a solvent and phosphor in the phosphor dispersion liquid.

The surface of the clay mineral may be modified (surface-treated) with an ammonium salt or the like in consideration of the compatibility with an organic solvent in a phosphor dispersion liquid.

Porous Inorganic Particles

Light transmissive ceramic layer 7 contains porous inorganic particles. Examples of the porous inorganic particles include metal oxides such as silicon oxide, titanium oxide, zinc oxide, aluminum oxide and zirconium oxide.

The volume-average particle diameter of the porous inorganic particles is preferably 1 nm to 50 μm in consideration of the dispersibility in a phosphor dispersion liquid. The specific surface area is preferably 200 $m^2$/g or more.

In light transmissive ceramic layer 7, porous inorganic particles can enter into gaps between phosphors to increase the film strength of light transmissive ceramic layer 7. Further, light transmissive ceramic layer 7 is formed by applying a phosphor dispersion liquid containing phosphor particles; when porous inorganic particles are blended and dispersed in the phosphor dispersion liquid, solvent enters into voids of the porous inorganic particles to effectively increase the viscosity of the phosphor dispersion liquid. Thus, although porous inorganic particles have a thickening effect, the viscosity of a phosphor dispersion liquid is not increased only with the increase in the proportion of porous inorganic particles, but the viscosity is determined by the ratio of porous inorganic particles to other components such as a solvent and a phosphor in a mixed solution.

The amount of the porous inorganic particles in light transmissive ceramic layer 7 is preferably 0.5 to 50 wt %, more preferably 0.5 to 45 wt %, and further preferably 1 to 40 wt %. When the amount of porous inorganic particles in light transmissive ceramic layer 7 exceeds 50 wt %, scattering of excitation light by porous inorganic particles increases and thus the luminance of the LED device decreases. When the amount of porous inorganic particles in light transmissive ceramic layer 7 is less than 0.5 wt %, the gaps between the interfaces of phosphor particles cannot sufficiently be filled up in light transmissive ceramic layer 7 and thus the film strength decreases.

Further, when the amount of the porous inorganic particles in light transmissive ceramic layer 7 is less than 0.5 wt %, the proportion of solid components such as phosphors in the phosphor dispersion liquid to be applied to form the layer increases to reduce the operability of the application procedure, making it difficult to apply the phosphor dispersion liquid such that uniform chromaticity is realized.

Furthermore, a silane coupling agent, a titanium coupling agent, or the like can be suitably applied as a modifier on the surface of the porous inorganic particles in consideration of their compatibility with a ceramic precursor and a solvent.

Binder

A binder contained in light transmissive ceramic layer 7 binds together phosphor particles. The binder is preferably a transparent ceramic such as glass from the perspective of increasing the heat resistance and the like of light transmissive ceramic layer 7. More specifically, the binder may be a polysiloxane or a polysilazane.

The amount of the transparent ceramic in light transmissive ceramic layer 7 is preferably 3 to 35 wt %, more preferably 10 to 30 wt %. When the amount of the transparent ceramic in light transmissive ceramic layer 7 is less than 3 wt %, the strength of light transmissive ceramic layer 7 decreases because the level of the transparent ceramic as a binder is too low. On the other hand, when the amount of the transparent ceramic exceeds 40 wt %, the amount of inorganic particles (such as porous inorganic particles and clay minerals) decreases relatively. When the amount of the inorganic particles relatively decreases, the strength of light transmissive ceramic layer 7 decreases. Further, when the amount of the inorganic particles in light transmissive ceramic layer 7 decreases relatively, the amount of the inorganic particles in the phosphor dispersion liquid also tends to decrease, and the viscosity of the phosphor dispersion liquid also tends to decrease.

Inorganic Particles

Light transmissive ceramic layer 7 may contain other optional components. Examples of the optional components include inorganic particles, including particles of metal oxides such as silicon oxide, titanium oxide, zinc oxide, aluminum oxide and zirconium oxide, and fluorides. These inorganic particles are dispersed in a phosphor dispersion liquid to form light transmissive ceramic layer 7, thereby capable of increasing the viscosity of the dispersion and suppressing the settling of phosphor particles. In addition, the inorganic particles also have the effect of entering into the gaps between phosphor particles, improving film strength.

Thickness of Light Transmissive Ceramic Layer 7

The thickness of light transmissive ceramic layer 7 is not particularly limited because it is set depending on the amount of phosphors that an LED device requires. However, the thickness of light transmissive ceramic layer 7 is preferably 150 μm or less, more preferably 100 μm or less. When the thickness of light transmissive ceramic layer 7 exceeds 150 μm, the concentration of phosphor particles in light transmissive ceramic layer 7 is generally excessively low. As a result, it may be hard to uniformly disperse phosphor particles, or film strength may be low.

Although the lower limit of the thickness of light transmissive ceramic layer 7 is not particularly limited, it is generally 15 μm or more, preferably 20 μm or more. Since the size (particle size) of phosphor particles is generally 10 μm or more, it may be difficult to set the thickness of a layer constituting wavelength conversion part 6 to less than 15 μm.

Further, the particle size of phosphors, porous inorganic particles and inorganic particles is desirably smaller than the thickness of light transmissive ceramic layer 7.

The thickness of light transmissive ceramic layer 7 means the maximum thickness of the layer disposed on the upper surface of LED chip 3 (see FIG. 1). Further, the thickness of light transmissive ceramic layer 7 formed on transparent plate 5 means the maximum thickness thereof. The thickness of the layer can be measured using a laser hologage.

(Protective Layer)

Light transmissive ceramic layer 7 may be covered with protective layer 8. For example, when a binder of light transmissive ceramic layer 7 is a transparent ceramic, light transmissive ceramic layer 7 may also be covered with a transparent ceramic having a different refractive index-.

2. Method of Manufacturing LED Device

The LED device of the present invention can be manufactured through the step of applying a phosphor dispersion liquid to form a light transmissive ceramic layer. The method for manufacturing the LED device can be roughly classified into two according to the types of the phosphor dispersion liquids used herein.

In the first method for manufacturing an LED device, a phosphor dispersion liquid containing phosphor particles, clay mineral, porous inorganic particles, and solvent (referred to as a "two-pack phosphor dispersion liquid") and a solution containing a binder precursor (referred to as a "precursor solution") are used. The two-pack phosphor dispersion liquid does not generally contain a binder precursor.

In the second method for manufacturing an LED device, a phosphor dispersion liquid containing phosphor particles, clay mineral, porous inorganic particles, binder precursor and solvent (referred to as a "one-pack phosphor dispersion liquid") is used.

[First Method for Manufacturing LED Device (Two-Pack Phosphor Dispersion Liquid)]

The first method for manufacturing an LED device includes applying the two-pack phosphor dispersion liquid. The first method can be further roughly classified into two modes.

Figure 5:
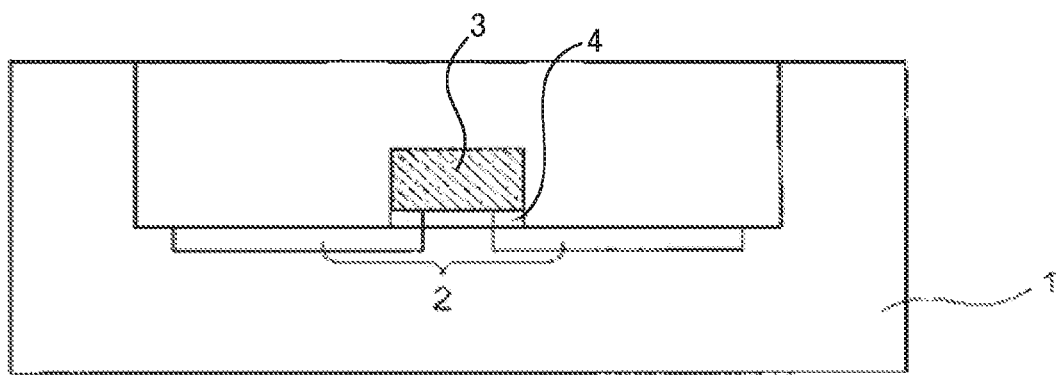
FIG. 5 illustrates an example of an LED chip package.

The first mode of the first method includes: 1) providing LED chip package 90 (see FIG. 5) including a package and an LED chip; 2) applying on the emission surface of the LED chip a two-pack phosphor dispersion liquid to form a phosphor layer; and 3) applying on the phosphor layer a solution (precursor solution) containing a binder precursor to form a light transmissive ceramic layer. Thereby, an LED device of the type shown in FIG. 1 is obtained.

The second mode of the first method includes: 1) applying on a light transmissive substrate a two-pack phosphor dispersion liquid, followed by drying to form a phosphor layer; 2) applying on the phosphor layer a precursor solution in which a light transmissive ceramic precursor is dispersed in a solvent, followed by calcination to form a wavelength conversion part made of a light transmissive ceramic layer; and 3) installing the light transmissive substrate on which the wavelength conversion part is formed in an LED chip package including a package and an LED chip having an emission surface and disposed on the package. The light transmissive substrate may be, for example, glass plate 5 in FIGS. 2 and 3. The wavelength conversion part is formed on glass plate 5, which is installed in a LED chip package as shown in FIGS. 2 and 3.

The two-pack phosphor dispersion liquid and the precursor solution may be alternately repeatedly applied.

Two-Pack Phosphor Dispersion Liquid

A two-pack phosphor dispersion liquid contains phosphor particles, a clay mineral, porous inorganic particles and a solvent, and may further contain optional inorganic particles. On the other hand, a two-pack phosphor dispersion liquid preferably does not contain a binder and a binder precursor. The type of phosphor particles, a clay mineral, porous inorganic particles and optional inorganic particles is as described above.

(Solvent)

Examples of solvents that can be used in the two-pack phosphor dispersion liquid include a combination of water and an organic solvent excellent in compatibility with water such as alcohols such as methanol, ethanol, propanol and butanol; and an organic solvent that is poorly soluble in water and does not contain water. When a phosphor which is degraded with water is used, a solvent that does not contain water is preferred. The use of an organic solvent having a boiling point of 150° C. or higher such as ethylene glycol and propylene glycol is advantageous from the perspective the pot life of a phosphor dispersion liquid, the prevention of nozzle clogging at the spray tip during spray coating of a phosphor dispersion liquid, or the like.

The two-pack phosphor dispersion liquid preferably contains an alcohol as a solvent. The alcohol may be a monohydric alcohol such as methanol, ethanol, propanol and butanol or may be a polyol having more than one hydroxyl group. Two or more different types of alcohols may be used in combination. The use of alcohols having more than one hydroxyl group as the dispersion solvent allows for an easy increase in the viscosity of the phosphor dispersion liquid and thereby settling of the phosphor particles, a dispersoid, is easily prevented.

The boiling point of the dispersion solvent is preferably 250° C. or below. The reason for this is to facilitate drying of the dispersion solvent from the dispersion solution. When the boiling point is too high, evaporation of the dispersion solvent is slow, so that when the dispersed solution is applied to form a coating film, the phosphor flows in the coating film and be aggregated.

For the polyol having more than one hydroxyl group, any polyol can be used as long as it can be used as solvent. Examples of polyols usable in the present invention include ethylene glycol, propylene glycol, diethylene glycol, glycerol, 1,3-butanediol, and 1,4-butanediol, with ethylene glycol, propylene glycol, 1,3-butanediol, 1,4-butanediol and the like being preferable.

When a phosphor that is hardly degraded with water is used, the solvent of the two-pack phosphor dispersion liquid may contain water. Water can increase the viscosity of the phosphor dispersion liquid by swelling clay minerals and optional fluoride particles. Since the swelling of clay minerals and the like may be prevented when water contains impurities, it is desirable that the water to be added be pure water containing no impurities.

Preparation of Two-pack Phosphor Dispersion Liquid

The two-pack phosphor dispersion liquid can be prepared by mixing phosphor particles with a solvent, followed by further mixing inorganic particles (porous inorganic particles and clay mineral), and optionally adding other inorganic particles.

The viscosity of the two-pack phosphor dispersion liquid is 10 to 1,000 cP, preferably 12 to 800 cP, and more preferably 20 to 600 cP.

Application of Two-Pack Phosphor Dispersion Liquid

The two-pack phosphor dispersion liquid is applied by a technique such as blade coating, spin coating, dispenser coating and spray coating. In particular, spray coating is preferred because it can easily form a thin coating film in a non-contact manner, and so it can easily form a thin phosphor layer.

Figure 4:
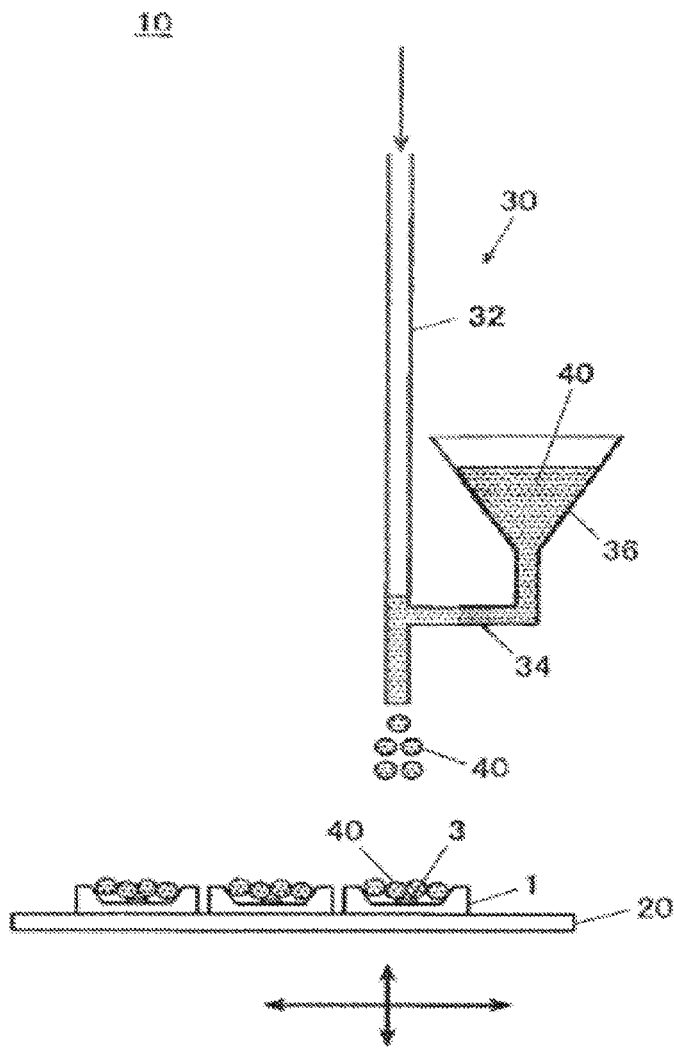
FIG. 4 is a schematic view of a sprayer.

FIG. 4 illustrates an example of an applicator for applying a phosphor dispersion liquid. Applicator 10 illustrated in FIG. 4 includes movable carriage 20 mainly movable up and down, right and left, and forward and backward, and sprayer 30 disposed above movable carriage 20. Sprayer 30 has a structure that allows for spraying of phosphor dispersion liquid 40.

Sprayer 30 has nozzle 32 into which air is sent, and an air compressor (not shown) for sending air is connected to nozzle 32. The pore size of the tip part of nozzle 32 is 20 µm to 2 mm, preferably 0.1 to 0.5 mm. Nozzle 32 is movable up and down, right and left, and forward and backward in the same manner as in movable carriage 20. For example, a spray gun W-101-142BPG manufactured by ANEST IWATA Corporation can be used as nozzle 32, and OFP-071C manufactured by ANEST IWATA Corporation can be used as a compressor.

Nozzle 32 can be adjusted for the discharge angle of a material to be discharged and is configured to be able to be inclined with respect to movable carriage 20 (or package 1 installed therein). The angle of nozzle 32 with respect to an object to be sprayed (package 1) is preferably in the range of 0 to 60° when the direction perpendicular to the object to be sprayed is defined as 0°.

Tank 36 is connected to nozzle 32 through connection pipe 34. Phosphor dispersion liquid 40 is stored in tank 36. Phosphor dispersion liquid 40 is always stirred with a stirrer (not shown) disposed in tank 36. When phosphor dispersion liquid 40 is stirred, settling of the phosphor having a high specific gravity can be suppressed, and the phosphor can be continuously dispersed in phosphor dispersion liquid 40. For example, PC-51 manufactured by ANEST IWATA Corporation is used as the tank.

When phosphor dispersion liquid 40 is applied, a plurality of LED chip packages in which LED chip 3 is mounted on package 1 are installed on movable carriage 20, and the positional relationship between package 1 and nozzle 32 of sprayer 30 is adjusted (position adjustment step). Specifically, package 1 is installed in movable carriage 20, and package 1 and the tip part of nozzle 32 are oppositely disposed. As the distance between package 1 and nozzle 32 is increased, phosphor dispersion liquid 40 can be more uniformly applied, but film strength tends to decrease. Therefore, it is suitable that the distance between package 1 and the tip part of nozzle 32 be held in the range of 3 to 30 cm.

Subsequently, phosphor dispersion liquid 40 is sprayed from nozzle 32 to apply phosphor dispersion liquid 40 to package 1 while relatively moving movable carriage 20 and nozzle 32 to each other (spraying and applying step). Specifically, movable carriage 20 and nozzle 32 are relatively moved to each other to allow package 1 and nozzle 32 to relatively move forward and backward, and right and left, to each other. The position of one of movable carriage 20 and nozzle 32 may be fixed, and the position of the other may be moved forward and backward, and right and left. A method is also preferably used in which a plurality of LED chips 3 are disposed in the direction orthogonal to the direction of movement of movable carriage 20 and phosphor dispersion liquid 40 is applied while moving nozzle 32 in the direction orthogonal to the direction of movement of movable carriage 20.

Air is sent into nozzle 32, and phosphor dispersion liquid 40 is sprayed from the tip part of nozzle 32 toward package 1. The distance between package 1 and nozzle 32 can be adjusted in the above range in consideration of the pressure of the air compressor. For example, the pressure of the compressor is adjusted so that the pressure at the entrance part (tip part) of nozzle 32 may be 0.14 MPa.

After applying the two-pack phosphor dispersion liquid to form a phosphor layer, a solution (precursor solution) containing a binder precursor is applied to the phosphor layer.

Precursor Solution

A precursor solution is a solution in which a ceramic precursor is dispersed in a solvent. The ceramic precursor may be any material as long as it can form a light transmissive ceramic, but it is generally a metal compound, in which the type of metal is not limited.

The precursor solution may be a solution (sol-gel solution) which forms a gel by a reaction such as hydrolysis and then forms a ceramic by heating, or may be a solution which directly forms a ceramic without gelation by volatilizing a solvent component.

The metal compound of the sol-gel solution may be an organic compound, or may be an inorganic compound. Examples of preferred metal compounds include metal alkoxides, metal acetylacetonates, metal carboxylates, nitrates and oxides. Among them, metal alkoxides are preferred because they easily form gels by hydrolysis and polymerization reaction, and tetraethoxysilane is particularly preferred. A plurality of metal compounds may be used in combination.

It is preferred that the precursor solution suitably contain water for hydrolysis, a solvent, a catalyst and the like, in addition to the metal compound. Examples of the solvent include alcohols such as methanol, ethanol, propanol and butanol. Examples of the catalyst include hydrochloric acid, sulfuric acid, nitric acid, acetic acid, fluoric acid, and ammonia.

When tetraethoxysilane is used as the metal compound of the precursor solution, it is preferred that the solution contain 138 parts by mass of ethyl alcohol and 52 parts by mass of pure water per 100 parts by mass of tetraethoxysilane.

In this case, the temperature for heating a gel is preferably 120 to 250° C., more preferably 120 to 200° C. from the perspective of further reducing the degradation of LED chip 3 and the like. Further, when a polysiloxane is used as the metal compound, the heating temperature after application is preferably 120 to 500° C., more preferably 120 to 350° C. from the perspective of further reducing the degradation of LED chip 3 and the like.

The ceramic precursor may be a polysilazane. The polysilazane is represented by following general formula (I):

$$(R^1R^2SiNR^3)_n \qquad (i)$$

where $R_1$, $R_2$ and $R_3$ each independently represent hydrogen, alkyl, aryl, vinyl or cycloalkyl, at least one of $R_1$, $R_2$ and $R_3$ represents hydrogen, preferably all of $R_1$, $R_2$ and $R_3$ represent hydrogen, and n represents an integer of 1 to 60.

The polysilazane may come in any molecular shape and may be for example linear or cyclic.

The polysilazane shown in the above formula (I) and an optional reaction accelerator are dissolved in a suitable solvent to prepare a precursor solution. A transparent ceramic film excellent in heat resistance and light resistance can be prepared by applying the precursor solution and subjecting the resulting coating film to heating, to excimer light treatment, or to UV light treatment to cure the same. In particular, additional thermal curing after curing by irradiation with UVU radiation containing a wavelength component from 170 to 230 nm (e.g., excimer light) can enhance the effect of moisture permeation prevention.

An acid or base is preferably used as a reaction accelerator, but the reaction accelerator may not necessarily be used. Examples of the reaction accelerator include, but not limited to, triethylamine, diethylamine, N,N-diethyl ethanolamine, N,N-dimethyl ethanolamine, triethanolamine, triethylamine, hydrochloric acid, oxalic acid, fumaric acid, sulfonic acid, acetic acid, and carboxylates of metals including nickel, iron, palladium, iridium, platinum, titanium and aluminum. A preferred example of the reaction accelerator is a metal carboxylate, and the amount thereof to be added is preferably 0.01 to 5 mol % based on the polysilazane.

When a polysilazane is used as a metal compound of the precursor solution, the solvent of the precursor solution may be aliphatic hydrocarbons, aromatic hydrocarbons, halogen hydrocarbons, ethers and esters. Preferred examples include methyl ethyl ketone, tetrahydrofuran, benzene, toluene, xylene, dimethyl fluoride, chloroform, carbon tetrachloride, ethyl ether, isopropyl ether, dibutyl ether, and ethyl butyl ether.

Further, polysilazane concentration in the precursor solution is the higher the better, but it is preferred that a polysilazane be dissolved in a solvent in an amount of 5 to 50 wt % because an increase in the concentration leads to shortening of the storage period of a polysilazane.

A precursor solution can be applied to a phosphor layer formed by applying a two-pack phosphor dispersion liquid, using applicator 10 of FIG. 4 in the same manner as in the application of a phosphor dispersion liquid. After the precursor solution is applied, it is calcined to convert a ceramic precursor to a transparent ceramic. Thereby, light transmissive ceramic layer 7 can be formed.

After light transmissive ceramic layer 7 is formed in this way, light transmissive ceramic layer 7 may be further covered with protective layer 8. Protective layer 8 may also be formed using a sprayer or a dispenser. LED device 100 is further provided with other optical components (such as a lens) and used as various optical members.

[Second Method for Manufacturing LED Device (One-pack Phosphor Dispersion Liquid)]

The second method for manufacturing an LED device includes applying a one-pack phosphor dispersion liquid. The second method can be further roughly classified into two modes.

The first mode of the second method includes: 1) providing LED chip package 90 (see FIG. 5) including a package and an LED chip; and 2) applying on the emission surface of the LED chip a one-pack phosphor dispersion liquid, followed by calcination to form a light transmissive ceramic layer.

The second mode of the second method includes: 1) applying to a light transmissive substrate a one-pack phosphor dispersion liquid, followed by drying and calcination to form a wavelength conversion part made of a light transmissive ceramic layer; and 2) installing the light transmissive substrate on which the wavelength conversion part is formed in an LED chip package including a package and an LED chip having an emission surface and disposed on the package. The light transmissive substrate may be, for example, glass plate 5 in FIGS. 2 and 3. The wavelength conversion part is formed on glass plate 5, which is installed in an LED chip package as shown in FIGS. 2 and 3.

One-Pack Phosphor Dispersion Liquid

A one-pack phosphor dispersion liquid contains phosphor particles, a clay mineral, porous inorganic particles, a binder precursor and a solvent, and may further contain optional inorganic particles. The types of the phosphor particles, clay mineral, porous inorganic particles, binder precursor and optional inorganic particles are as described above.

A one-pack phosphor dispersion liquid is different from a two-pack phosphor dispersion liquid in that the former contains a binder precursor as an essential component.

A binder precursor contained in the one-pack phosphor dispersion liquid is an organometallic compound such as a metal alkoxide, a metal acetylacetonate and a metal carboxylate, similar to the two-pack phosphor dispersion liquid.

A solvent of the one-pack phosphor dispersion liquid may be the same as that used in the two-pack phosphor dispersion liquid, but when a phosphor that is degraded by water is used, it is generally preferred that the solvent contain no water.

The concentration of the phosphor in the one-pack phosphor dispersion liquid is preferably 60 to 95 wt % based on the sum of the mass of phosphor particles, the mass of inorganic particles (including clay mineral, porous inorganic particles and the like), and the mass of ceramic, a cured product of a binder precursor. A wavelength conversion part made of a layer having a high phosphor density is obtained by applying and drying such a phosphor dispersion liquid on the emission surface of an LED chip.

A one-pack phosphor dispersion can be prepared by mixing a binder or a binder precursor and phosphor particles with a solvent, followed by further mixing with aluminum silicate, and optionally adding other inorganic particles (tabular particles and/or oxide particles).

The viscosity of the one-pack phosphor dispersion liquid is 10 to 1,000 cP, preferably 12 to 800 cP, and more preferably 20 to 600 cP.

Similar to the application of a two-pack phosphor dispersion liquid, examples of application techniques of a one-pack phosphor dispersion liquid include blade coating, spin coating, dispenser coating or spray coating. For example, the dispersion liquid is applied using an applicator including a sprayer illustrated in FIG. 4.

After one-pack phosphor dispersion liquid 40 is applied to LED chip 3 or to a light transmissive substrate, it is calcined to convert a ceramic precursor to a transparent ceramic, thereby capable of forming light transmissive ceramic layer 7.

After light transmissive ceramic layer 7 is formed in this way, light transmissive ceramic layer 7 may be further covered with protective layer 8. Protective layer 8 may also be formed using a sprayer or a dispenser. LED device 100 is further provided with other optical components (such as a lens) and used as various optical members.

The application of a phosphor dispersion liquid and a precursor solution may be performed using a dispenser or an inkjet apparatus instead of applicator 10 having sprayer 30 illustrated in FIG. 4, or using any of various other conventionally-known methods such as bar coating or spin coating.

When a dispenser is used, such a nozzle is used that can control the addition amount a coating liquid and that is not clogged with phosphors and the like. For example, a non-contact jet dispenser manufactured by Musashi Engineering, Inc. or a dispenser of the same company can be used. Also when an inkjet apparatus is used, such a nozzle that can control the amount of discharge of a coating liquid and is not clogged with a phosphor or the like is used. For example, an inkjet apparatus manufactured by Konica Minolta IJ Technologies, Inc. can be used.

A phosphor dispersion liquid or a precursor solution may be applied to an LED chip package through a mask to be applied only to a necessary part thereof. In particular, when electrodes to be connected to an LED chip package are exposed, electrical connection is prevented when a wavelength conversion layer or a ceramic layer is provided over the electrode by spraying. For this reason, it is necessary that only a necessary part be coated thorough a mask by spraying.

EXAMPLES

Hereinafter, the present invention will be described in more detail with reference to Examples, which however shall not be construed as limiting the scope of the present invention.

(1) Preparation of Phosphor Particles

Yellow phosphor particles were produced in the procedure described below. Phosphor raw material having the following composition was fully mixed and loaded into an aluminum crucible followed by the addition of an appropriate amount of fluoride such as ammonium fluoride as flux. The loaded materials were calcined for 2 to 5 hours at 1,350 to 1,450° C. in reducing atmosphere under hydrogen containing-nitrogen gas flow to afford a calcined product having the composition $((Y_{0.72}Gd_{0.24})_3Al_5O_{12}:Ce_{0.04})$.

[Raw Material Composition]

$Y_2O_3$ ... 7.41 g
$Gd_2O_3$ ... 4.01 g
$CeO_2$ ... 0.63 g
$Al_2O_3$ ... 7.77 g

The calcined product was pulverized, washed, separated and dried to afford a desired phosphor. The phosphor was then pulverized to produce phosphor particles of about 10 μm diameter. The phosphor was confirmed to be desired one by analyzing the composition of the phosphor particles. The emission wavelength of the phosphor for 465 nm excitation light had a peak wavelength at roughly 570 nm.

The phosphor dispersion liquids and the precursor solutions of Examples and Comparative Examples were prepared using the following materials.

[(Porous) Inorganic Particles]

SILYSIA 470: having an average primary particle diameter of 14 μm and a specific surface area of 300 $m^2/g$ (Fuji Silysia Chemical Ltd.)

RX300: silylated silicic anhydride, having an average particle size of primary particles of 7 nm and a specific surface area of 300 $m^2/g$ (Nippon Aerosil Co., Ltd.)

VM-2270: having an average particle size of primary particles of 10 μm and a specific surface area of 700 $m^2/g$ (Dow Corning Toray Co., Ltd.)

H-122: SUNSPHERE H-122, having an average particle size of primary particles of 12 μm and a specific surface area of 700 $m^2/g$ (AGC Si-Tech. Co., Ltd.)

NanoTek Silica: silica, having an average particle size of primary particles of 25 nm and a specific surface area of 95 $m^2/g$ (CIK NanoTek, Corporation)

F3: Hi-Silica F3, having an average particle size of primary particles of 3 μm and a specific surface area of 0.9 $m^2/g$ (NITCHITSU CO., LTD.)

[Clay Mineral]

MK-100: Synthetic mica (CO—OP CHEMICAL CO., LTD.)

SWN: Lucentite SWN (CO—OP CHEMICAL CO., LTD.)

[Precursor Solution]

Polysiloxane dispersion: consisting of 14 wt % of polysiloxane and 86 wt % of IPA (isopropyl alcohol)

Polysilazane dispersion: consisting of 20 wt % of polysilazane and 80 wt % of dibutyl ether (NL120-20, manufactured by AZ Electronic Materials Co., Ltd.)

Example 1

1 g of the phosphor, 0.05 g of MK-100, 0.05 g of RX300, and 1.5 g of propylene glycol were mixed to prepare a phosphor dispersion liquid (two-pack type).

The prepared phosphor dispersion liquid was spray-coated on an LED device using the applicator of FIG. 4 at a spray pressure of 0.2 MPa and a moving speed of a stage robot of 100 mm/s and dried at 50° C. for 1 hour to form a phosphor layer.

Subsequently, the phosphor layer was spray-coated with the polysiloxane dispersion (consisting of 14 wt % of polysiloxane and 86 wt % of IPA) as a precursor solution at a spray pressure of 0.1 MPa and a moving speed of a stage robot of 100 mm/s Subsequently, the phosphor of the phosphor layer was fixed by calcination at 150° C. for 1 hour to form a light transmissive ceramic layer. The LED device having a wavelength conversion part as illustrated in FIG. 1 was manufactured (protective layer 8 was omitted). This spray step was repeated five times to manufacture five LED devices each having a wavelength conversion part.

Example 2

1 g of the phosphor, 0.05 g of SWN, 0.05 g of RX300, and 1.5 g of propylene glycol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Example 3

1 g of the phosphor, 0.05 g of SWN, 0.05 g of RX300, 0.75 g of isopropyl alcohol and 1 g of propylene glycol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Example 4

1 g of the phosphor, 0.05 g of SWN, 0.3 g of RX300, 0.75 g of isopropyl alcohol and 1 g of propylene glycol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Example 5

0.8 g of the phosphor, 0.05 g of SWN, 0.5 g of RX300, 0.75 g of isopropyl alcohol and 1 g of propylene glycol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Example 6

1 g of the phosphor, 0.1 g of SWN, 0.05 g of RX300, 0.75 g of isopropyl alcohol and 1 g of propylene glycol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Example 7

1 g of the phosphor, 0.2 g of SWN, 0.25 g of RX300, 0.75 g of isopropyl alcohol and 1 g of propylene glycol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Example 8

1 g of the phosphor, 0.03 g of SWN, 0.05 g of RX300, 0.75 g of isopropyl alcohol and 1 g of 1,3-butanediol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Example 9

1 g of the phosphor, 0.03 g of SWN, 0.05 g of SILYSIA 470, 0.75 g of isopropyl alcohol and 1 g of ethylene glycol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Example 10

1 g of the phosphor, 0.05 g of SWN, 0.08 g of SILYSIA 470, 0.75 g of isopropyl alcohol and 1 g of 1,3-butanediol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Example 11

1 g of the phosphor, 0.03 g of SWN, 0.05 g of VM-2270, 0.75 g of isopropyl alcohol and 1 g of 1,3-butanediol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Example 12

1 g of the phosphor, 0.03 g of SWN, 0.05 g of H-122, 0.75 g of isopropyl alcohol and 1 g of 1,3-butanediol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Example 13

1 g of the phosphor, 0.05 g of SWN, 0.05 g of RX-300 and 1.5 g of propylene glycol were mixed to prepare a phosphor dispersion liquid (two-pack type). The prepared phosphor dispersion liquid was used to form a phosphor layer, and a light transmissive ceramic layer was then formed to manufacture an LED device, in the same manner as in Example 1.

Table 1 shows the blending ratios of solids (except solvent) in the phosphor dispersion liquids.

TABLE 1

| | | Blending ratio (% by weight) | | | | | | | | | | | | |
|---|---|---|---|---|---|---|---|---|---|---|---|---|---|---|
| Component name | | Example 1 | Example 2 | Example 3 | Example 4 | Example 5 | Example 6 | Example 7 | Example 8 | Example 9 | Example 10 | Example 11 | Example 12 | Example 13 |
| Solids in two-pack phosphor dispersion liquid | Phosphor NanoTek | 91.0 | 91.0 | 91.0 | 74.1 | 59.3 | 87.0 | 69.0 | 92.6 | 92.6 | 88.5 | 92.6 | 92.6 | 9.10 |
| | Silica RX300 | 4.5 | 4.5 | 4.5 | 22.2 | 37.0 | 4.3 | 17.2 | 4.6 | | | | | 4.5 |
| | SILYSIA 470 | | | | | | | | | 4.6 | 7.1 | | | |
| | VM-2270 | | | | | | | | | | | 4.6 | | |
| | H-122 | | | | | | | | | | | | 4.6 | |
| | F3 | | | | | | | | | | | | | |
| | SWN | | 4.5 | 4.5 | 3.7 | 3.7 | 8.7 | 13.8 | 2.8 | 2.8 | 4.4 | 2.8 | 2.8 | 4.5 |
| | MK-100 | 4.5 | | | | | | | | | | | | |
| | total | 100.0 | 100.0 | 100.0 | 100.0 | 100.0 | 100.0 | 100.0 | 100.0 | 100.0 | 100.0 | 100.0 | 100.0 | 100.0 |
| Precursor solution | Polysiloxane | ○ | ○ | ○ | ○ | ○ | ○ | ○ | ○ | ○ | ○ | ○ | ○ | — |
| | Polysilazane | — | — | — | — | — | — | — | — | — | — | — | — | ○ |

Example 14

1 g of the phosphor, 0.05 g of SWN, 0.05 g of RX300, 1 g of propylene glycol and 1 g of the polysiloxane dispersion were mixed to prepare a phosphor dispersion liquid (one-pack type).

The prepared phosphor dispersion liquid was spray-coated on an LED device using the applicator of FIG. 4 at a spray pressure of 0.2 MPa and a moving speed of a stage robot of 100 mm/s and fired at 150° C. for 1 hour to form a light transmissive ceramic layer containing a phosphor. This spray step was repeated five times to manufacture five LED devices each having a wavelength conversion part.

Example 15

1 g of the phosphor, 0.03 g of SWN, 0.05 g of RX300, 1 g of 1,3-butanediol and 1 g of the polysiloxane dispersion were mixed to prepare a phosphor dispersion liquid (one-pack type). The prepared phosphor dispersion liquid was used to manufacture an LED device in the same manner as in Example 14.

Example 16

1 g of the phosphor, 0.08 g of SWN, 0.1 g of SILYSIA 470, 1 g of propylene glycol and 1 g of the polysiloxane dispersion were mixed to prepare a phosphor dispersion liquid (one-pack type). The prepared phosphor dispersion liquid was used to manufacture an LED device in the same manner as in Example 14.

Example 17

1 g of the phosphor, 0.03 g of SWN, 0.05 g of VM-2270, 1 g of 1,3-butanediol and 1 g of the polysiloxane dispersion were mixed to prepare a phosphor dispersion liquid (one-pack type). The prepared phosphor dispersion liquid was used to manufacture an LED device in the same manner as in Example 14.

Example 18

1 g of the phosphor, 0.03 g of SWN, 0.05 g of H-122, 1 g of 1,3-butanediol and 1 g of the polysiloxane dispersion were mixed to prepare a phosphor dispersion liquid (one-pack type). The prepared phosphor dispersion liquid was used to manufacture an LED device in the same manner as in Example 14.

Table 2 shows the blending ratios of solids (except solvent) in the phosphor dispersion liquids.

TABLE 2

| | | Blending ratio (% by weight) | | | | |
|---|---|---|---|---|---|---|
| Component name | | Example 14 | Example 15 | Example 16 | Example 17 | Example 18 |
| Solids in one-pack phosphor dispersion liquid | Phosphor NanoTek Silica | 80.6 | 81.9 | 75.7 | 81.9 | 81.9 |
| | RX300 | 4.0 | 4.1 | | | |
| | SILYSIA 470 | | | 7.6 | | |
| | VM-2270 | | | | 4.1 | |
| | H-122 | | | | | 4.1 |
| | F3 | | | | | |
| | SWN | 4.0 | 2.5 | 6.1 | 2.5 | 2.5 |
| | MK-100 | | | | | |
| | Polysiloxane | 11.4 | 11.5 | 10.6 | 11.5 | 11.5 |
| | Total | 100.0 | 100.0 | 100.0 | 100.0 | 100.0 |

Example 19

The same phosphor dispersion liquid as in Example 3 was prepared. This phosphor dispersion liquid was spray-coated on a glass substrate (50 mm×20 mm×1 mm in thickness) using the applicator of FIG. 4 at a spray pressure of 0.2 MPa and a moving speed of a stage robot of 100 mm/s and dried at 50° C. for 1 hour to form a phosphor layer.

Subsequently, the phosphor layer was spray-coated with 1 g of the polysiloxane dispersion as a precursor solution at a spray pressure of 0.1 MPa and a moving speed of a stage robot of 100 mm/s, and the phosphor of the phosphor layer was fixed by calcination at 150° C. for 1 hour to form a light transmissive ceramic layer on the glass substrate.

The glass substrate having a wavelength conversion part was cut into 1-mm squares, and any one thereof was attached on LED chip 3 of the LED device (the same one as used in Examples 1 to 18) as illustrated in FIG. 2. This attaching step was repeated five times to manufacture five LED devices each having a wavelength conversion part.

Example 20

The same phosphor dispersion liquid as in Example 14 was prepared. This phosphor dispersion liquid was spray-coated on a glass substrate (50 mm×20 mm×1 mm in thickness) using the applicator of FIG. 4 at a spray pressure of 0.2 MPa and a moving speed of a stage robot of 100 mm/s and dried at 150° C. for 1 hour to form a light transmissive ceramic layer on the glass substrate.

This glass substrate having a wavelength conversion part was cut into 1-mm squares, and any one thereof was attached on a light emitting chip of the LED device (the same one as used in Examples 1 to 18) as illustrated in FIG. 2. This attaching step was repeated five times to manufacture five LED devices each having a wavelength conversion part.

Comparative Example 1

1 g of the phosphor and 1 g of isopropyl alcohol were mixed to prepare a phosphor dispersion liquid. This phosphor dispersion liquid was spray-coated on an LED device using the applicator of FIG. 4 at a spray pressure of 0.2 MPa and a moving speed of a stage robot of 100 mm/s and dried at 50° C. for 1 hour to form a phosphor layer.

Subsequently, the phosphor layer was spray-coated with the polysiloxane dispersion (consisting of 14 wt % of polysiloxane and 86 wt % of IPA) as a precursor solution at a spray pressure of 0.1 MPa and a moving speed of a stage robot of 100 mm/s. The phosphor of the phosphor layer was fixed by calcination at 150° C. for 1 hour to form a wavelength conversion part, and an LED device having a wavelength conversion part as illustrated in FIG. 2 was manufactured. This spray step was repeated five times to manufacture five LED devices each having a wavelength conversion part.

Comparative Example 2

1 g of the phosphor, 0.08 g of NanoTek Silica and 1.5 g of propylene glycol were mixed to prepare a phosphor dispersion liquid. This phosphor dispersion liquid was used to form a phosphor layer, which was then used to manufacture an LED device, in the same manner as in Comparative Example 1.

Comparative Example 3

1 g of the phosphor, 0.05 g of NanoTek Silica, 0.05 g of SWN, 0.75 g of isopropyl alcohol and 1 g of propylene glycol were mixed to prepare a phosphor dispersion liquid. This phosphor dispersion liquid was used to form a phosphor layer, which was then used to manufacture an LED device, in the same manner as in Comparative Example 1.

Comparative Example 4

1 g of the phosphor, 0.08 g of F3, 0.05 g of SWN, 0.75 g of isopropyl alcohol and 1 g of propylene glycol were mixed to prepare a phosphor dispersion liquid. This phosphor dispersion liquid was used to form a phosphor layer, which was then used to manufacture an LED device, in the same manner as in Comparative Example 1.

Table 3 shows the blending ratios of solids (except solvent) in the phosphor dispersion liquids.

TABLE 3

| | | Blending ratio (% by weight) | | | |
|---|---|---|---|---|---|
| | Component name | Comparative Example 1 | Comparative Example 2 | Comparative Example 3 | Comparative Example 4 |
| Solids in two-pack phosphor dispersion liquid | Phosphor | 100.0 | 92.6 | 91.0 | 88.5 |
| | NanoTek Silica RX300 | | 7.4 | 4.5 | |
| | SILYSIA 470 | | | | |
| | VM-2270 | | | | |
| | H-122 | | | | |
| | F3 | | | | 7.1 |
| | SWN | | | 4.5 | 4.4 |
| | MK-100 | | | | |
| | total | 100.0 | 100.0 | 100.0 | 100.0 |
| Precursor solution | Polysiloxane | ○ | ○ | ○ | ○ |
| | Polysilazane | — | — | — | — |

Comparative Example 5

1 g of the phosphor, 0.05 g of NanoTek Silica, 0.05 g of SWN, 1 g of the polysiloxane dispersion and 1 g of propylene glycol were mixed to prepare a phosphor dispersion liquid. This phosphor dispersion liquid was used to form a phosphor layer, which was then used to manufacture an LED device, in the same manner as in Example 14.

Table 4 shows the blending ratios of solids (except solvent) in the phosphor dispersion liquid.

TABLE 4

| | Component name | Blending ratio (% by weight) Comparative Example 5 |
|---|---|---|
| Solids in one-pack phosphor dispersion liquid | Phosphor | 80.7 |
| | NanoTek Silica RX300 | 4.0 |
| | SILYSIA 470 | |
| | VM-2270 | |
| | H-122 | |
| | F3 | |
| | SWN | 4.0 |
| | MK-100 | |
| | Polysiloxane | 11.3 |
| | total | 100.0 |

[Viscosity of Phosphor Dispersion Liquid]

The viscosities of the phosphor dispersion liquids prepared in Examples 1 to 20 and Comparative Examples 1 to 5 were measured using an oscillation viscometer (VM-10A-L, manufactured by CBC Co., Ltd.). The measurements are set forth in Table 5 (Examples 1 to 20) and Table 6 (Comparative Examples 1 to 5).

[Chromaticity of Emission]

The chromaticity of emission of 5 samples of the light-emitting devices manufactured in Examples 1 to 20 and Comparative Examples 1 to 5 was measured using a spectral radiance meter (CS-1000A, manufactured by Konica Minolta Sensing, Inc.). The measurement results are shown in Table 5 (Examples 1 to 20) and Table 6 (Comparative Examples 1 to 5).

The chromaticity shown in Tables 5 and 6 is defined by a point where a straight line connecting a certain point to the origin crosses the plane x+y+z=1 in the CIE-XYZ color system in which color space is represented by the XYZ coordinate system. The chromaticity is represented by a value of x and y, and the z-coordinate obtained from the relationship of x+y+z=1 is omitted. The chromaticity of white light is (0.33, 0.33); and when a chromaticity is closer to this value, a light source has a chromaticity closer to white light. Bluish white is obtained when a value of the x-coordinate is smaller, and yellowish white is obtained when a value of the x-coordinate is larger. Five chromaticity values in Tables 5 and 6 are the respective chromaticity of coated samples of five LED devices.

A standard deviation was calculated from the five measured values, and the uniformity of chromaticity was compared and evaluated. As an index of evaluation, when the standard deviation was 0.02 or less, the variation in chromaticity was regarded as practically satisfactory. The average value of standard deviations was used for evaluation, and the results were represented by the following criteria (A, B, C):
"A" . . . 0.01 or less;
"B" . . . Larger than 0.01 and 0.02 or less; and
"C" . . . Larger than 0.02.

[Supernatant Generation Time for Phosphor Dispersion Liquid]

The phosphor dispersion liquids prepared in Examples 1 to 20 and Comparative Examples 1 to 5 were allowed to stand to measure the time it takes until a supernatant is generated. The supernatant is generated by the settling of phosphor particles. A glass bottle having an inside diameter of 15 mm was filled with 5 ml of each phosphor dispersion, and was allowed to stand at room temperature. The time until the production of a supernatant of each phosphor dispersion liquid was measured. These measurement results are shown in Table 5 (Examples 1 to 20) and Table 6 (Comparative Examples 1 to 5). When a supernatant is not generated in 4 hours as an index of evaluation, the phosphor dispersion liquid can be used by suitably controlling the dispersion completion time of the phosphor dispersion liquid in consideration of the consumption of the phosphor dispersion liquid in the applicator. However, in order to show superiority over a silicone used for encapsulating an LED device at present, the phosphor dispersion liquid was evaluated according to the following criteria (A, B, C) in consideration of the pot life of the silicone:
"A" . . . No supernatant was generated for 6 hours or longer;
"B" . . . A supernatant was generated in 4 hours to 6 hours; and
"C" . . . A supernatant was generated in 4 hours or less.

TABLE 5

| | Viscosity (mPa·s) | Chromaticity | 1 | 2 | 3 | 4 | 5 | Standard deviation | Average of standard deviation | Evaluation of chromaticity | Evaluation of supernatant production time |
|---|---|---|---|---|---|---|---|---|---|---|---|
| Example 1 | 180 | x value | 0.321 | 0.349 | 0.342 | 0.329 | 0.344 | 0.0116 | 0.0156 | B | A |
| | | y value | 0.325 | 0.36 | 0.348 | 0.333 | 0.31 | 0.0195 | | | |
| Example 2 | 300 | x value | 0.336 | 0.322 | 0.329 | 0.344 | 0.336 | 0.0083 | 0.0089 | A | A |
| | | y value | 0.342 | 0.327 | 0.334 | 0.352 | 0.343 | 0.0095 | | | |
| Example 3 | 250 | x value | 0.328 | 0.338 | 0.341 | 0.322 | 0.344 | 0.0093 | 0.0098 | A | A |
| | | y value | 0.331 | 0.343 | 0.346 | 0.325 | 0.349 | 0.0103 | | | |
| Example 4 | 280 | x value | 0.335 | 0.342 | 0.331 | 0.323 | 0.32 | 0.0089 | 0.0096 | A | A |
| | | y value | 0.339 | 0.347 | 0.334 | 0.325 | 0.322 | 0.0102 | | | |
| Example 5 | 300 | x value | 0.342 | 0.334 | 0.328 | 0.336 | 0.322 | 0.0077 | 0.0082 | A | A |
| | | y value | 0.347 | 0.337 | 0.332 | 0.341 | 0.324 | 0.0088 | | | |
| Example 6 | 260 | x value | 0.327 | 0.342 | 0.331 | 0.324 | 0.343 | 0.0087 | 0.0093 | A | A |
| | | y value | 0.33 | 0.347 | 0.334 | 0.326 | 0.348 | 0.01 | | | |
| Example 7 | 290 | x value | 0.339 | 0.321 | 0.345 | 0.332 | 0.329 | 0.0092 | 0.0098 | A | A |
| | | y value | 0.343 | 0.323 | 0.35 | 0.335 | 0.332 | 0.0104 | | | |
| Example 8 | 320 | x value | 0.326 | 0.329 | 0.341 | 0.337 | 0.343 | 0.0074 | 0.0081 | A | A |
| | | y value | 0.329 | 0.332 | 0.346 | 0.341 | 0.349 | 0.0087 | | | |
| Example 9 | 330 | x value | 0.328 | 0.336 | 0.324 | 0.341 | 0.327 | 0.007 | 0.0074 | A | A |
| | | y value | 0.331 | 0.34 | 0.327 | 0.346 | 0.331 | 0.0078 | | | |
| Example 10 | 350 | x value | 0.326 | 0.331 | 0.328 | 0.328 | 0.341 | 0.006 | 0.0066 | A | A |
| | | y value | 0.329 | 0.334 | 0.331 | 0.332 | 0.347 | 0.0072 | | | |
| Example 11 | 400 | x value | 0.334 | 0.341 | 0.328 | 0.33 | 0.331 | 0.0051 | 0.0055 | A | A |
| | | y value | 0.338 | 0.346 | 0.331 | 0.333 | 0.334 | 0.0059 | | | |
| Example 12 | 300 | x value | 0.326 | 0.344 | 0.338 | 0.327 | 0.331 | 0.0077 | 0.0081 | A | A |
| | | y value | 0.329 | 0.349 | 0.342 | 0.33 | 0.334 | 0.0085 | | | |
| Example 13 | 300 | x value | 0.343 | 0.331 | 0.337 | 0.338 | 0.323 | 0.0077 | 0.008 | A | A |
| | | y value | 0.348 | 0.335 | 0.341 | 0.342 | 0.326 | 0.0083 | | | |
| Example 14 | 250 | x value | 0.339 | 0.326 | 0.33 | 0.334 | 0.32 | 0.0073 | 0.008 | A | A |
| | | y value | 0.345 | 0.33 | 0.333 | 0.338 | 0.322 | 0.0086 | | | |
| Example 15 | 280 | x value | 0.325 | 0.331 | 0.337 | 0.342 | 0.341 | 0.0072 | 0.0078 | A | A |
| | | y value | 0.327 | 0.334 | 0.341 | 0.347 | 0.346 | 0.0085 | | | |
| Example 16 | 280 | x value | 0.338 | 0.33 | 0.337 | 0.329 | 0.345 | 0.0065 | 0.0072 | A | A |
| | | y value | 0.342 | 0.333 | 0.342 | 0.332 | 0.351 | 0.0078 | | | |

TABLE 5-continued

|  | Viscosity (mPa·s) | Chromaticity | 1 | 2 | 3 | 4 | 5 | Standard deviation | Average of standard deviation | Evaluation of chromaticity | Evaluation of supernatant production time |
|---|---|---|---|---|---|---|---|---|---|---|---|
| Example 17 | 340 | x value | 0.326 | 0.329 | 0.336 | 0.341 | 0.33 | 0.006 | 0.0064 | A | A |
|  |  | y value | 0.328 | 0.332 | 0.34 | 0.345 | 0.333 | 0.0068 |  |  |  |
| Example 18 | 260 | x value | 0.344 | 0.331 | 0.328 | 0.335 | 0.323 | 0.0081 | 0.0088 | A | A |
|  |  | y value | 0.35 | 0.334 | 0.331 | 0.34 | 0.325 | 0.0095 |  |  |  |
| Example 19 | 250 | x value | 0.321 | 0.33 | 0.338 | 0.328 | 0.341 | 0.008 | 0.0086 | A | A |
|  |  | y value | 0.323 | 0.333 | 0.342 | 0.331 | 0.346 | 0.0091 |  |  |  |
| Example 20 | 300 | x value | 0.324 | 0.334 | 0.33 | 0.341 | 0.339 | 0.0069 | 0.0079 | A | A |
|  |  | y value | 0.327 | 0.348 | 0.334 | 0.347 | 0.342 | 0.009 |  |  |  |

TABLE 6

|  | Viscosity (mPa·s) | Chromaticity | 1 | 2 | 3 | 4 | 5 | Standard deviation | Average of standard deviation | Evaluation of chromaticity | Evaluation of supernatant production time |
|---|---|---|---|---|---|---|---|---|---|---|---|
| Comparative Example 1 | 3 | x value | 0.380 | 0.325 | 0.328 | 0.318 | 0.355 | 0.0258 | 0.0256 | C | C |
|  |  | y value | 0.390 | 0.340 | 0.354 | 0.325 | 0.370 | 0.0254 |  |  |  |
| Comparative Example 2 | 80 | x value | 0.326 | 0.291 | 0.319 | 0.341 | 0.331 | 0.0189 | 0.0220 | C | C |
|  |  | y value | 0.334 | 0.295 | 0.329 | 0.363 | 0.346 | 0.0251 |  |  |  |
| Comparative Example 3 | 230 | x value | 0.331 | 0.325 | 0.319 | 0.341 | 0.326 | 0.0082 | 0.0085 | A | B |
|  |  | y value | 0.336 | 0.331 | 0.323 | 0.347 | 0.331 | 0.0088 |  |  |  |
| Comparative Example 4 | 220 | x value | 0.340 | 0.329 | 0.338 | 0.342 | 0.321 | 0.0088 | 0.0093 | A | B |
|  |  | y value | 0.347 | 0.335 | 0.344 | 0.354 | 0.329 | 0.0099 |  |  |  |
| Comparative Example 5 | 200 | x value | 0.339 | 0.336 | 0.322 | 0.337 | 0.322 | 0.0085 | 0.0095 | A | B |
|  |  | y value | 0.348 | 0.344 | 0.326 | 0.344 | 0.327 | 0.0104 |  |  |  |

The results of investigation have revealed that since the phosphor dispersion liquids of Comparative Examples 1 and 2 have low viscosity, the phosphors are prone to settle down, and the variation in chromaticity between LED devices is large. On the other hand, since the phosphor dispersion liquids of Comparative Examples 3 to 5 have high viscosity, the variation in chromaticity is small, but the phosphors settled in 4 to 6 hours.

On the other hand, since the phosphor dispersion liquids of Examples 1 to 18 have high viscosity, LED devices in which phosphors do not settle down for a long time and chromaticity is stable were manufactured. Examples 19 to 20 have revealed that a method in which phosphors are not directly applied to a light-emitting device is also effective.

INDUSTRIAL APPLICABILITY

The LED device provided by the present invention is used also as a light-emitting device in applications requiring color uniformity.

The invention claimed is:

1. A method for manufacturing an LED device having an LED chip and a wavelength conversion part to convert light emitted from the LED chip to light having a wavelength different from a wavelength of the light emitted from the LED chip, the method comprising:
    providing an LED chip package including a package and an LED chip disposed on the package, the LED chip having an emission surface;
    applying on the emission surface of the LED chip a phosphor dispersion liquid containing a solvent, a phosphor, a clay mineral and porous inorganic particles, the phosphor, the clay mineral and the porous inorganic particles being dispersed in the solvent, followed by drying to form a phosphor layer; and
    applying on the phosphor layer a precursor solution in which a light transmissive ceramic precursor is dispersed in a solvent, followed by calcination to form a wavelength conversion part made of a light transmissive ceramic layer in which the phosphor, the clay mineral and the porous inorganic particles are dispersed.

2. The manufacturing method according to claim 1, wherein a specific surface area of the porous inorganic particles is 200 m²/g or more.

3. The manufacturing method according to claim 1, wherein an average particle size of primary particles of the porous inorganic particles is 0.001 to 50 μm.

4. The manufacturing method according to claim 1, wherein in the light transmissive ceramic layer, an amount of the porous inorganic particles is 0.5 to 50 wt %, and an amount of the clay mineral is 0.5 wt % to 20 wt %.

5. A method for manufacturing an LED device having an LED chip and a wavelength conversion part to convert light emitted from the LED chip to light having a wavelength different from a wavelength of the light emitted from the LED chip, the method comprising:
    applying on a light transmissive substrate a phosphor dispersion liquid containing a solvent, a phosphor, a clay mineral and porous inorganic particles, the phosphor, the clay mineral and the porous inorganic particles being dispersed in the solvent, followed by drying to form a phosphor layer;
    applying on the phosphor layer a precursor solution in which a light transmissive ceramic precursor is dispersed in a solvent, followed by calcination to form a wavelength conversion part made of a light transmissive ceramic layer in which the phosphor, the clay mineral and the porous inorganic particles are dispersed; and
    installing the light transmissive substrate on which the wavelength conversion part is formed in an LED chip package including a package and an LED chip having an emission surface and disposed on the package.

6. The manufacturing method according to claim 5, wherein a specific surface area of the porous inorganic particles is 200 m$^2$/g or more.

7. The manufacturing method according to claim 5, wherein an average particle size of primary particles of the porous inorganic particles is 0.001 to 50 μm.

8. The manufacturing method according to claim 5, wherein in the light transmissive ceramic layer, an amount of the porous inorganic particles is 0.5 to 50 wt %, and an amount of the clay mineral is 0.5 to 20 wt %.

* * * * *